(12) United States Patent
Tung

(10) Patent No.: US 11,782,093 B2
(45) Date of Patent: Oct. 10, 2023

(54) DETECTION SYSTEM AND DETECTION METHOD

(71) Applicant: AmTRAN Technology Co., Ltd., New Taipei (TW)

(72) Inventor: Yen-Ting Tung, New Taipei (TW)

(73) Assignee: AmTRAN Technology Co., Ltd., New Taipei (TW)

( * ) Notice: Subject to any disclaimer, the term of this patent is extended or adjusted under 35 U.S.C. 154(b) by 259 days.

(21) Appl. No.: 17/123,142

(22) Filed: Dec. 16, 2020

(65) Prior Publication Data

US 2021/0373076 A1    Dec. 2, 2021

(30) Foreign Application Priority Data

May 29, 2020   (TW) ................................ 109118140

(51) Int. Cl.
*G01R 31/319* (2006.01)
*H04B 3/54* (2006.01)

(52) U.S. Cl.
CPC . *G01R 31/31905* (2013.01); *G01R 31/31924* (2013.01); *G01R 31/31926* (2013.01); *H04B 3/542* (2013.01)

(58) Field of Classification Search
CPC ........ G01R 31/31905; G01R 31/31924; G01R 31/31926; H04B 3/542; H04B 3/54
USPC ........................................................ 714/724
See application file for complete search history.

(56) References Cited

U.S. PATENT DOCUMENTS

| | | | | |
|---|---|---|---|---|
| 2003/0030459 A1* | 2/2003 | Sabey | ................ | G01R 31/2805 324/750.19 |
| 2015/0192638 A1* | 7/2015 | Jung | .................. | G01R 31/2893 324/757.01 |
| 2015/0309105 A1* | 10/2015 | Ostrovsky | .............. | H02H 3/335 324/509 |
| 2017/0126421 A1* | 5/2017 | Kelsey | ................ | H04L 12/2816 |
| 2017/0141815 A1* | 5/2017 | Sun | ........................ | H04B 3/542 |

FOREIGN PATENT DOCUMENTS

| | | |
|---|---|---|
| CN | 1670889 A | 9/2005 |
| CN | 105738720 A | 7/2016 |
| CN | 209231637 U | 8/2019 |
| CN | 110232881 A | 9/2019 |
| TW | M352679 U | 3/2009 |

* cited by examiner

*Primary Examiner* — James C Kerveros
(74) *Attorney, Agent, or Firm* — CKC & Partners Co., LLC

(57) ABSTRACT

The present disclosure relates to a detection system including a control circuit, a power line network bridge circuit, a fixture device and a detection device. The control circuit is configured to generate a plurality of detection signals. The power line network bridge circuit receives detection signals through a power line. The fixture device is electrically connected to the power line through the power line network bridge, and is configured to receive the detection signals. The fixture device is configured to transmit the detection signals to a device under test, so that the device under test displays a plurality of media. The detection device is configured to capture the media and transmit the media to the control circuit. The control circuit is further configured to determine whether the media match with detection parameters.

8 Claims, 4 Drawing Sheets

DETECTION SYSTEM AND DETECTION METHOD

CROSS-REFERENCE TO RELATED APPLICATION

This application claims priority to Taiwan Application Serial Number 109118140, filed May 29, 2020, which is herein incorporated by reference in its entirety.

BACKGROUND

Technical Field

The present disclosure relates to a detection system, especially used to detect media displayed by a device under test.

Description of Related Art

After a device is assembled completely on the production line, a quality detection process is required to ensure that the performance of the device meets the standards. Traditionally, the detection process includes multiple steps, corresponding to different performance tests. However, the efficiency of traditional detection methods is not ideal, and it is impossible to obtain the detection result of each performance of the device in real time and accurately.

SUMMARY

One aspect of the present disclosure is a detection system, comprising a control circuit, a power line network bridge circuit, a fixture device and a detection device. The control circuit is configured to generate a plurality of detection signals. The power line network bridge circuit is configured to receive the plurality of detection signals through a power line. The fixture device is electrically connected to the power line through the power line network bridge, and configured to receive the plurality of detection signals. The fixture device is further configured to transmit the plurality of detection signals to a device under test. The device under test displays a plurality of media according to the plurality of detection signals. The detection device is configured to capture the plurality of displayed media and configured to transmit the plurality of displayed media to the control circuit. The control circuit is further configured to determine whether the plurality of transmit media match with a plurality of detection parameters.

Another aspect of the present disclosure is a detection method, comprising: transmitting a plurality of detection signals from a control circuit to a fixture device through a power line network bridge circuit and a power line; transmitting the plurality of detection signals to a device under test by the fixture device; capturing, by a detection device, a media displayed by the device under test; determining whether the displayed media match with a detection parameter; controlling a conveying device to convey the fixture device from a first position to a second position when the displayed media match with the detection parameter; and controlling the conveying device to convey the fixture device from the first position to a third position when the displayed media do not match with the detection parameter.

It is to be understood that both the foregoing general description and the following detailed description are by examples, and are intended to provide further explanation of the disclosure as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

For the embodiment below is described in detail with the accompanying drawings, embodiments are not provided to limit the scope of the present disclosure. Moreover, the operation of the described structure is not for limiting the order of implementation. Any device with equivalent functions that is produced from a structure formed by a recombination of elements is all covered by the scope of the present disclosure. Drawings are for the purpose of illustration only, and not plotted in accordance with the original size.

It will be understood that when an element is referred to as being "connected to" or "coupled to", it can be directly connected or coupled to the other element or intervening elements may be present. In contrast, when an element to another element is referred to as being "directly connected" or "directly coupled," there are no intervening elements present. As used herein, the term "and/or" includes an associated listed items or any and all combinations of more.

Figure 1:
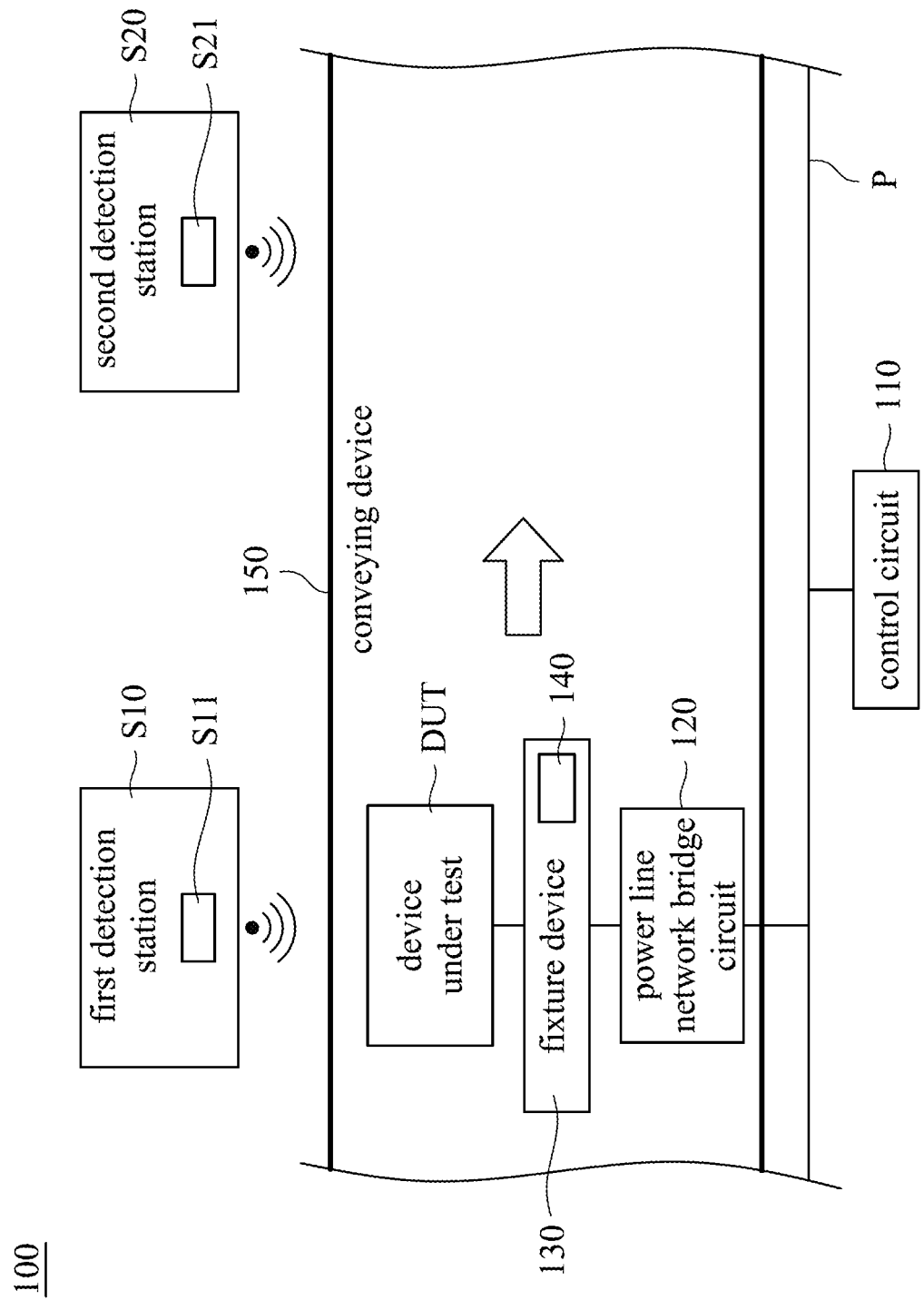
FIG. 1 is a schematic diagram of a detection system in some embodiments of the present disclosure.

FIG. 1 is a schematic diagram of a detection system 100 in some embodiments of the present disclosure. As shown in FIG. 1, the detection system 100 includes a control circuit 110, a power line network bridge circuit 120, a fixture device 130 and a detection device 140. The control circuit 110 is configured to generate multiple detection signals. In some embodiments, the control circuit 110 may be a computer used to perform various operations. The control circuit 110 may be implemented by a microcontroller, a microprocessor, a digital signal processor, an application specific integrated circuit (ASIC) or a logic circuit.

In one embodiment, the power line network bridge circuit 120 is arranged on the power supply port of the power grid, such as a socket. That is the power line network bridge circuit 120 is electrically connected to the control circuit 110 through the power line P, and receives the detection signals through the power line P. In some embodiments, the detection signals are sent in data packet format.

In one embodiment, the fixture device 130 is configured to fix a device under test (DUT), and is electrically connected to the power line network bridge circuit 120 by the power line P power line to receive the detection signals. In some embodiments, the fixture device 130 has at least a connect port compatible with HDMI, AUDIO, UART or I2C interface standard. In some other embodiments, the fixture device 130 is provided with multiple connect ports, the connection interface of each connect port is one of multiple connection interfaces of HDMI, AUDIO, UART and I2C. Similarly, the device under test DUT is provided with a corresponding connection interface of HDMI, AUDIO, UART and I2C, so as to connect to the fixture device 130 and performs data transmission.

The fixture device 130 is configured to transmit the detection signals to the device under test DUT, so that the device under test DUT displays a plurality of media according to the detection signals. The media could be video or audio media file. In some embodiments, the control circuit 110 transmits a media file and the detection signals to the fixture device 130, so as to transmit the media file to the device under test DUT through the fixture device 130. Then the media file is displayed by the device under test DUT. In some other embodiments, the media file is stored in a storage device of the fixture device 130 in advance. When receives the detection signals, the fixture device 130 transmit the detection signals and the media file obtained from the storage device to the device under test DUT. In another embodiment, the media file is stored in the device under test DUT in advance. The control circuit 110 transmits the detection signals to the power line network bridge circuit 120 through the power line P. Then, the power line network bridge circuit 120 transmits the detection signals to the device under test DUT through the fixture device 130. The device under test DUT displays the pre-stored the media according to the detection signals.

In one embodiment, the detection device 140 is electrically connected to the control circuit 110. When the media is displayed by the device under test DUT, the displayed media is captured by the detection device 140 and then the captured media is transmit to the control circuit 110. In some embodiments, the detection device includes a microphone or a camera, configured to capture the media displayed by the device under test DUT. In addition, in one embodiment, the detection devices 140 is arranged in the fixture device 130, or integrated with the fixture device 130, so that the detection device 140 may correspond to position of a display panel or a speaker of the device under test DUT. In another embodiment, the detection device 140 is not directly connected to the fixture device 130, but is electrically connected to the control circuit 110.

In one embodiment, the control circuit 110 is further configured to determine whether the media transmit from the detection device 140 matches with a plurality of detection parameters to confirm whether the display function of the device under device DUT passes the corresponding detection process. The detection parameters can be parameters controlled by the device under test DUT when displaying the media. For example, to determine whether the similarity between the color of the image displayed by the device under test DUT and the color of the predetermined ideal image meets/reaches a standard value, or to determine whether the noise in the sound displayed by the device under test DUT is less than a standard value, or determine whether the image update speed of the device under test DUT meets a standard value.

In one embodiment, the media includes a first media and a second media. The first media is a video file and the second media is an audio file. At a first time period, the detection device 140 records an image displayed by the device under test DUT, and transmits a recording result to the control circuit 110. The control circuit 110 compares whether the recording result (i.e., the first media) matches with a first detection parameter. Then, in a second time period, the detection device 140 records the audio showed by the device under test DUT, and transmits the audio recording result to the control circuit 110. The control circuit 110 compares the recording result (i.e., the second media) matches with a second detection parameter.

As shown in FIG. 1, in some embodiments, after the device under test DUT connected to the fixture device 130 finishing the detection process of the first detection station S10, the device under test DUT and the fixture device will perform other detection process at the second inspection station S20. For example, the first detection station S10 has a specific detection environment (e.g., a specific environmental brightness), so that the detection device 140 detects the video effect of the device under test DUT under the specific detection environment. The second detection station S20 has another specific detection environment (e.g., specific environmental noise), so that the detection device 140 detects the audio effect of the device under test DUT under the another specific detection environment.

It should be noted that, in some other embodiments, the fixture device 130 usually transmits data to the control circuit 110 through a wired connection interface, such as Universal Asynchronous Receiver/Transmitter (UART), Serial Peripheral Interface Bus (SPI) or Inter-Integrated Circuit (I2C). However, when the device under test DUT moves between detection stations, it is necessary to manually connect/disconnect the above connection interface to the device under test DUT for data transmission. In order to overcome the manual connection/disconnection, the control circuit 110 is connected to the device under test DUT through the power line P and the power line network bridge circuit 120. With this connection, during the detection process, the device under test DUT can continuously transmit data with the control circuit 110 to eliminate the time and cost of manual plugging and unplugging of the connection interface. In other words, the control circuit 110 transmits the detection signals to the fixture device 130 remotely through the power line P. At the same time, the detection device 140 also transmits the captured media back to the control circuit 110 through the power line P or other path. Then the control circuit 110 determines whether the device under test DUT passes the current detection process. Therefore, the detection system 100 will have better management capabilities, detection accuracy and detection efficiency.

As shown in FIG. 1, in some embodiments, the detection system 100 further includes a conveying device 150 (e.g., a conveyor belts, robotic arms, etc.) The fixture device 130 and the detection device 140 are conveyed to different positions through the conveying device 150. In some embodiments, the power line network bridge circuit 120, the fixture device 130 and the device under test DUT are arranged on the conveying device 150, so that the positions of the power line network bridge circuit 120, the fixture device 130 and the object to be identified DUT are changed through the conveying device 150. For example, the fixture device 130 could be conveyed to the first position corresponding to the first detection station S10 or the second position corresponding to the second detection station S20. In another embodiment, when determining that the detection process of a specific detection station (e.g., the first detection station) is not passed, the control circuit 110 may transmit a notification to record that the device under test DUT does not pass the detection process of the detection station. The control circuit 110 controls the conveying device 150 to convey the device under test DUT to a third position corresponding to a maintenance station. The above notification can include a serial number of the device under test DUT, an information that the detection process does not be pass, a detection and comparison results, possible reasons for failure, or an information about the detection station.

Figure 2:
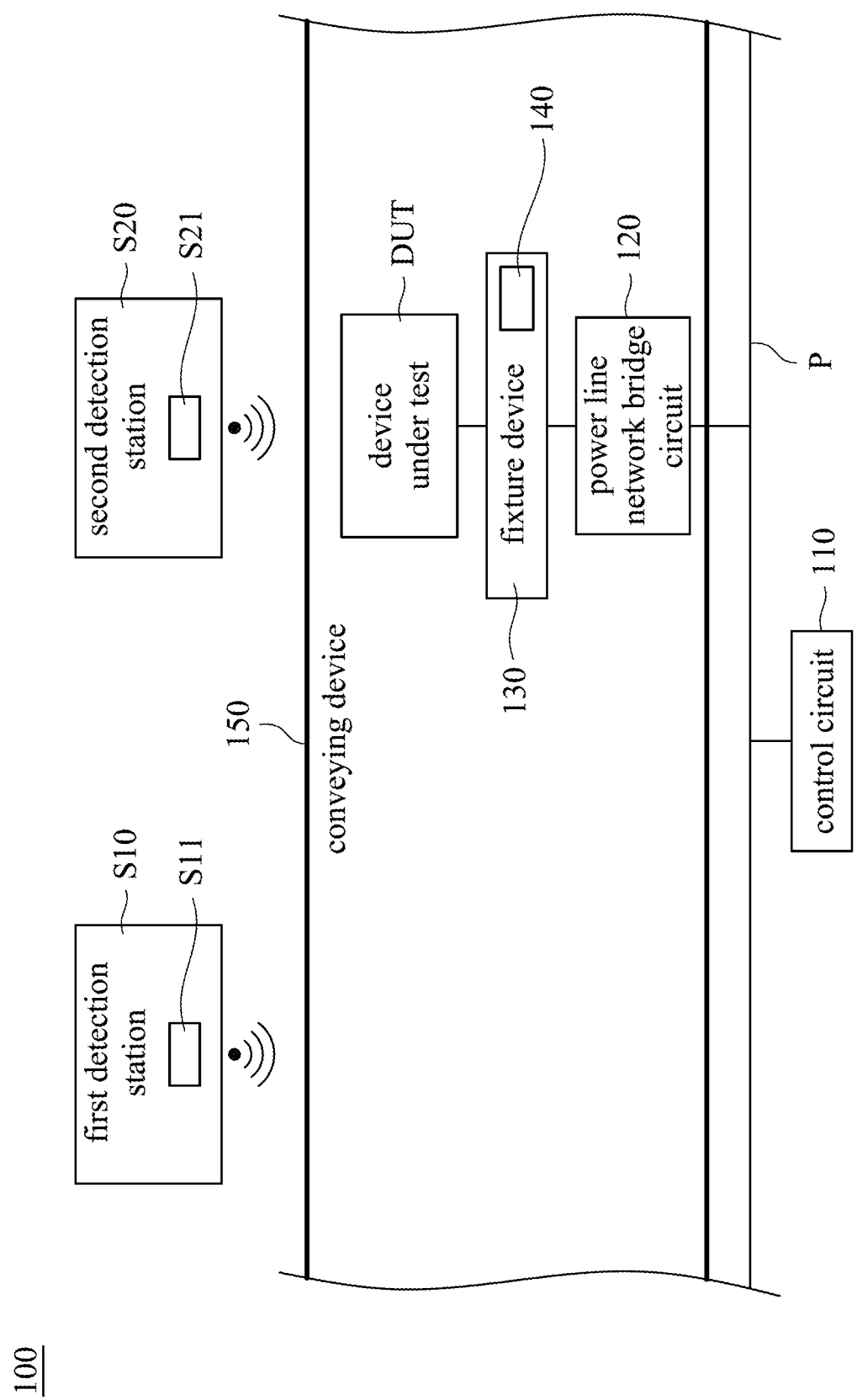
FIG. 2 is a schematic diagram of a detection system in some embodiments of the present disclosure.

As shown in FIG. 1, when the fixture device 130 is in the first position corresponding to the first detection station S10, the detection device 140 is used to capture the first media displayed by the device under test DUT. When the first media captured by the detection device 140 matches with the first detection parameter, the control circuit 110 transmits a confirmation signal to the conveying device 150, so that the conveying device 150 conveys the fixture device 130 from the first position to the second position corresponding to the second detection station S20 (as shown in FIG. 2).

As mentioned above, when the control circuit 110 determines that the first media captured by the detection device 140 does not match with the first detection parameter, the control circuit 110 transmits an alarm signal to the conveying device 150 to convey the fixture device 130 from the first position to a third position different from the second position. The third position corresponds to the maintenance station, and the device under test DUT that does not pass the detection process will be moved to the maintenance station.

In some embodiments, the distance between the third position and the second position is different from the distance between the third position and the first position. For example, the second position is located two units of distance to the right of the first position, and the third position is located three units of distance to the left of the first position. In addition, the conveying direction of the conveying device 150 is not limited to the manner shown in FIG. 1 and FIG. 2. In some embodiments, the conveying device 150 may also have the ability to convey to multiple directions. For example, the first position and the second position are located in the first conveying direction, the third position is located in the second conveying direction, and there is an angle between the first conveying direction and the second conveying direction (e.g., 90 degrees). People of ordinary skill in the art can understand the definition and operation of the conveying device so it will not be described here.

In one embodiment, the first detection station S10 includes a first wireless sensor S11. The second detection station S20 includes a second wireless sensor S21. In one embodiment, each detection station (e.g., the first detection station S10 or the second detection station S20) can be coupled to another power line network bridge circuit to establish a link. In another embodiment, each detection station (e.g., the first detection station S10 or the second detection station S20) can establish a link with the control circuit 110 through other paths, such as WiFi or other communication protocols. In addition, the fixture device 130 or the detection device 140 may be provided with a wireless sensor module (not shown in the figure) for wireless coupled to the first wireless sensor S11 and the second wireless sensor S21 (e.g., through bluetooth or NFC). When the wireless sensor module is coupled to the wireless sensor (e.g., the first wireless sensor S11 or the second wireless sensor S21), the wireless sensor can receive information of the fixture device 130 or the device under test DUT. Then, the wireless sensor transmits the information to the control circuit 110, so that the control circuit 110 ensures that the fixture device 130 or the object to be identified DUT has moved to the specific detection station. In some embodiments, when the fixture device 130 is moved to the first position, the first wireless sensor S11 establishes a wireless connection with the wireless sensor module on the fixture device 130. Then the first wireless sensor S11 is able to transmit a first identification signal to the fixture device 130 to the fixture device 130, and obtain the information of the fixture device 130 or the device under test DUT from the fixture device 130. Next, the first wireless sensor S11 transmits this information to the control circuit 110. Similarly, when the fixture device 130 is moved to the second position, the second wireless sensor S21 can establish a wireless connection with the wireless sensor module on the fixture device 130 to transmit a second identification signal to the fixture device 130, and obtains the information of the fixture device 130 or the device under test DUT to the control circuit 110. Accordingly, the control circuit 110 determines which detection station the fixture device 130 or device under test DUT is based on this information, so that the control circuit 110 transmits the detection signals to a specific detection station.

Figure 3:
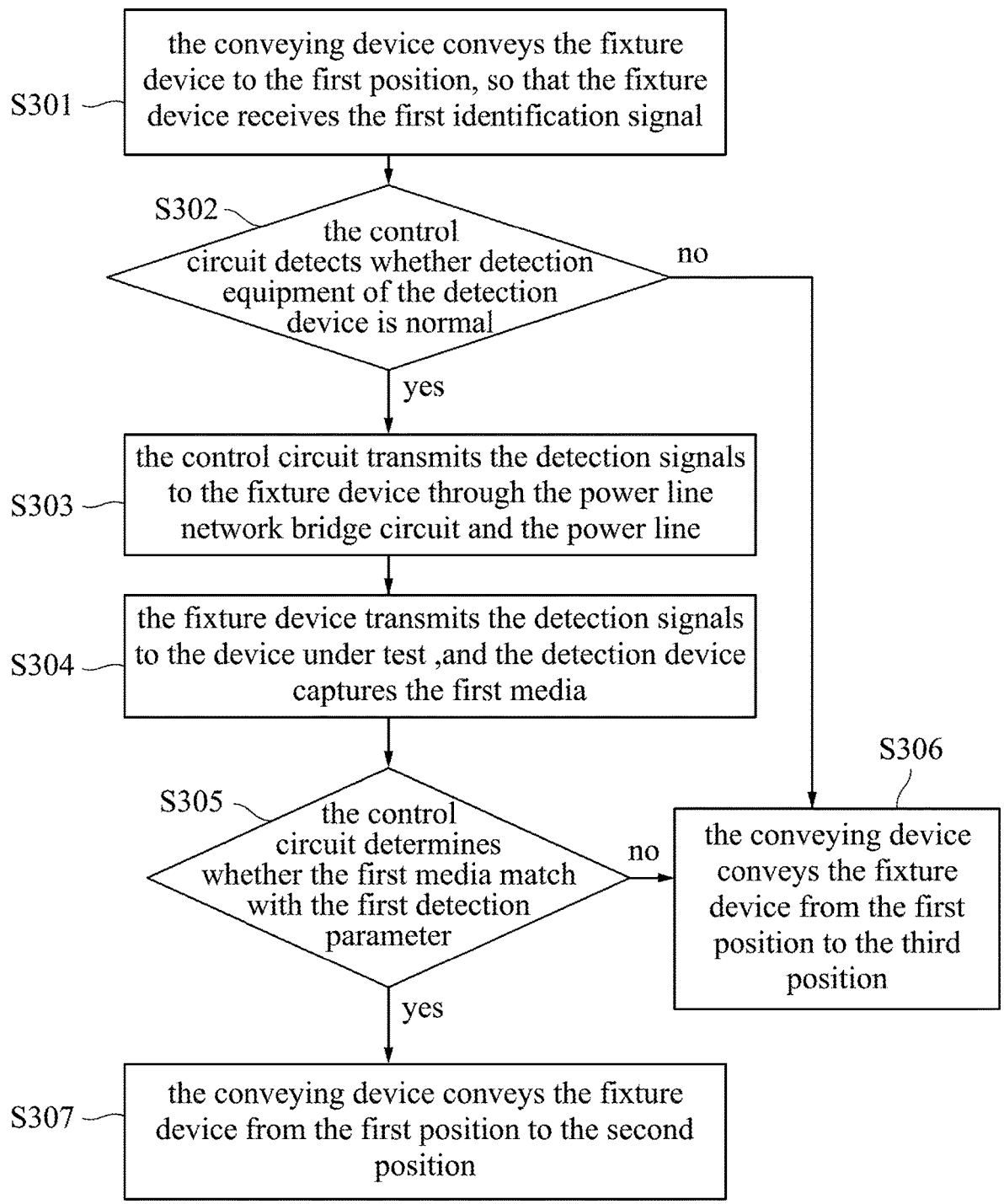
FIG. 3 is a flowchart illustrating a detection method in some embodiments of the present disclosure.

As shown in FIG. 3, the following describes the detection method of some embodiments of the present disclosure. In step S301, the conveying device 150 conveys the fixture device 130 with the detection device 140 to the first position corresponding to the first detection station S10, so that the fixture device 130 wirelessly receives the first identification signal from the first wireless sensor S11, and transmits the identification information, which comprises the information used to identify the fixture device 130 or the device under test DUT, and the first identification signal to the control circuit 110. The control circuit 110 determines that the object to be identified DUT is located near the first position according to the first identification signal and the identification information corresponding to the fixture device 130 or the object to be identified DUT.

In step S302, the control circuit 110 detects whether detection equipment of the detection device 140 (e.g., video effect, audio effect) is normal. For example, the control circuit 110 transmits a test command "CC-70 77-01-05-00-FF", and the detection device 140 generates a response command "CC-70-77-01-05-01-FF". If the control circuit 110 determines that the sixth code in the response command is "01", it means that the detection device 140 is normal. The data packet transmitted between the control circuit 110 and the detection device 140 (i.e., test command, response command or the detection signals) can be attached to the application layer of the TCP/IP packet format.

If the control circuit 110 determines that the detection device 140 is abnormal, Step S306 will be conducted. The conveying device 150 moves the fixture device 130 to the third position. If the control circuit 110 determines that the detection device 140 is normal, step S303 will be conducted. The control circuit 110 transmits the detection signals to the fixture device 130 through the power line network bridge circuit 120 and the power line P. In some embodiments, the detection signals transmitted by the control circuit 110 include the file related to the first media, so that the object to be identified DUT can show the first media in the media that needs to be detected. In some embodiments, the detection signals transmitted by the control circuit 110 do not include the file related to the first media. The file related to the first media can be stored in the fixture device 130 in advance. After receiving the detection signals, the fixture device transmits the pre-stored file of the first media and the detection signals to the object to be identified DUT, so that the object to be identified DUT shows the first media in the media that needs to be detected.

In step S304, the fixture device 130 inputs the detection signals to the object to be identified DUT, so that the object to be identified DUT shows the first media according to the detection signals. When showing the first media, the detection device 140 captures the first media of the media showed by the object to be identified DUT. In one embodiment, the fixture device 130 transmits image files to the object to be identified DUT through the HDMI interface, so as to display the image screen. In another embodiment, the fixture device 130 transmits audio files to the object to be identified DUT, so that the object to be identified DUT shows audio.

In step S305, the control circuit 110 receives the first media through the power line P and the power line network bridge circuit 120, and determines whether the first media matches with the first detection parameter. In step S306, if the first media do not match with the first detection parameter, the control circuit transmits an error signal to the conveying device 150, and the conveying device 150 moves the fixture device 130 from the first position to the third position. In step S307, if the first media matches with the first detection parameter, the control circuit 110 transmits a confirmation signal to the conveying device 150, the conveying device 150 moves the fixture device 130 from the first position to the second position corresponding to the second detection station S20.

After completing the foregoing steps, the detection system 100 can perform the second detection process with the second detection station S20 in accordance with the same principle as the foregoing steps S301-S306. In other words, when the fixture device 130 receives the second identification signal, the fixture device 130 transmits the second identification signal and the identification information, which is corresponding to the fixture device 130 or the object to be identified DUT, to the control circuit 110 through the power line P. The control circuit 110 determines that the object to be identified DUT is located near the second position according to the second identification signal and the identification information, and perform the second detection process at the second detection station S20 according to the foregoing steps S301-S306.

Figure 4:
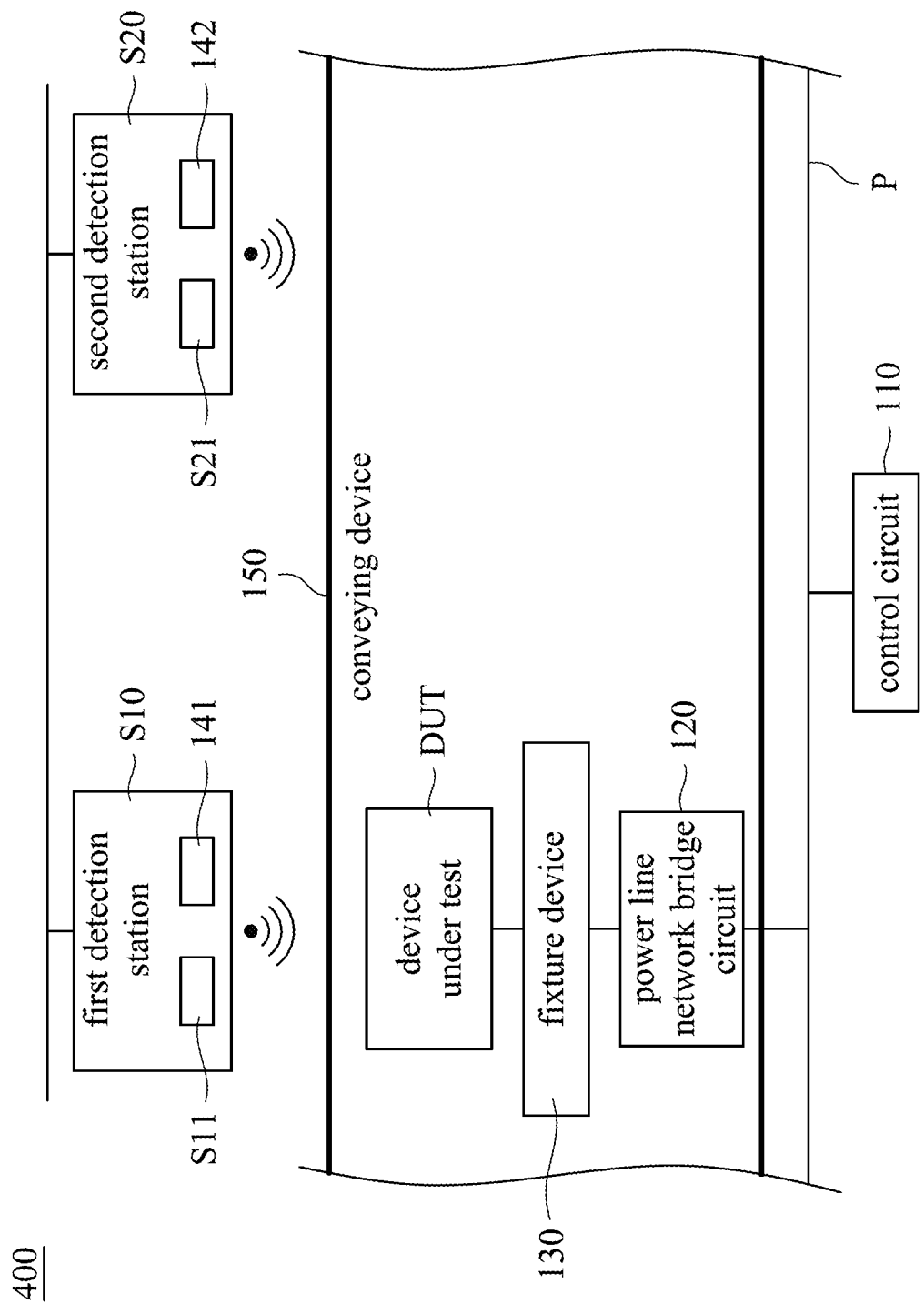
FIG. 4 is a schematic diagram of a detection system in some embodiments of the present disclosure.

In the above embodiments, the detection device 140 is arranged on the fixture device 130 to move with the fixture device 130. In some other embodiments, the detection device can be arranged on the detection station. FIG. 4 is another schematic diagram of a detection system 400 in some embodiments of the present disclosure. In FIG. 4, the similar components associated with the embodiment of FIG. 1 are labeled with the same numerals for ease of understanding. The specific principle of the similar component has been explained in detail in the previous paragraphs, and unless it has a cooperative relationship with the components of FIG. 4, it is not repeated here.

As shown in FIG. 4, the detection device includes a first detector 141 and a second detector 142. The first detector 141 is arranged in the first detection station S10 to capture the first media showed when the object to be identified DUT is in the first position. The first detector 141 is electrically connected to the control circuit 110, and is configured to transmit the captured first media to the control circuit 110. Similarly, the second detector 142 is arranged in the second detection station S20 to capture the second media shoed by the object to be identified DUT when the object to be identified DUT is in the second position. Accordingly, the control circuit 110 can receive the first media and the second media through the control circuit 110. When the control circuit 110 determines that the first media matches with the first detection parameter, the control circuit 110 transmits a confirmation signal to the conveying device 150 to control the conveying device 150 to move the fixture device 130 from the first position to the second position. The first detector 141 and the second detector 142 described above can be coupled to the control circuit 110 through the power line P or other coupling methods. Accordingly, the control circuit may determine whether the video and audio function of the object to be identified DUT is normal. The above "other coupling methods" may be, for example, USB, Ethernet or other wired connection, or other wireless connection such as WiFi or Bluetooth.

The elements, method steps, or technical features in the foregoing embodiments may be combined with each other, and are not limited to the order of the specification description or the order of the drawings in the present disclosure.

It will be apparent to those skilled in the art that various modifications and variations can be made to the structure of the present disclosure without departing from the scope or spirit of the present disclosure. In view of the foregoing, it is intended that the present disclosure cover modifications and variations of this present disclosure provided they fall within the scope of the following claims.

What is claimed is:

1. A detection system, comprising:
a control circuit configured to generate a plurality of detection signals;
a power line network bridge circuit configured to receive the plurality of detection signals through a power line;
a fixture device electrically connected to the power line through the power line network bridge circuit, and configured to receive the plurality of detection signals from the control circuit, wherein the fixture device is further configured to transmit the plurality of detection signals to a device under test, and the device under test display a plurality of media according to the plurality of detection signals from the control circuit;
a detection device configured to capture the plurality of media displayed by the device under test and configured to transmit the plurality of captured media to the control circuit, wherein the control circuit is further configured to determine whether the plurality of captured media match with a plurality of detection parameters; and
a conveying device, wherein the fixture device and the device under test are arranged on the conveying device, and the conveying device is configured to convey the fixture device and the device under test from a position to another position,
wherein when the control circuit determines a first media of the plurality of captured media matches with a first detection parameter of the plurality of detection parameters, the control circuit is configured to control the conveying device to convey the fixture device and the device under test from a first position to a second position; and when the control circuit determines the first media of the plurality of media does not match with the first detection parameter of the plurality of detection parameters, the control circuit is configured to control the conveying device to convey the fixture device and the device under test from the first position to a third position.

2. The detection system of claim 1, wherein the detection device is arranged on the fixture device, and the conveying device is configure to convey the fixture device and the detection device from a position to another position.

3. The detection system of claim 1, wherein the detection device comprises:
a first detector configured to capture a first media of the plurality of media displayed by the device under test, and configured to transmit the first media to the control circuit; and
a second detector configured to capture a second media of the plurality of media displayed by the device under test, wherein when the control circuit determines that the first media matches with a first detection parameter of the plurality of detection parameters, the control circuit is configured to control the conveying device to convey the fixture device from a first position corresponding to the first detector to a second position corresponding to the second detector.

4. The detection system of claim 1, further comprising:
a first wireless sensor configured to communicate with the fixture device, wherein when the fixture device is moved to a first position, the first wireless sensor transmits a first identification signal to the fixture device; and
a second wireless sensor configured to communicate with the fixture device, wherein when the fixture device is moved to a second position, the second wireless sensor transmits a second identification signal to the fixture device;
wherein when receiving the first identification signal, the fixture device transmits the first identification signal and an identification information to the control circuit through the power line, and the control circuit determines that the device under test is near the first position according to the first identification signal and the identification information;
wherein the identification information comprises an information of the device under test or the fixture device; and
wherein when receiving the second identification signal, the fixture device transmits the second identification signal and the identification information to the control circuit through the power line, and the control circuit determines that the device under testis near the second position according to the second identification signal and an another identification information.

5. The detection system of claim 1, wherein the detection device is a microphone or camera.

6. The detection system of claim 1, wherein the fixture device is electrically connected to the device under test through an interface comprising HDMI, AUDIO, UART or I2C.

7. A detection method, comprising:
transmitting a plurality of detection signals from a control circuit to a fixture device through a power line network bridge circuit and a power line;
transmitting the plurality of detection signals to device under test by the fixture device;
capturing, by a detection device, a media displayed by the device under test;
transmitting, by the detection device, the captured media to the control circuit;
determining, by the control circuit, whether the captured media match with a detection parameter;
controlling a conveying device to convey the fixture device from a first position to a second position when the captured media match with the detection parameter, wherein the fixture device and the device under test are arranged on the conveying device, and the conveying device is configured to convey the fixture device and the device under test; and
controlling the conveying device to convey the fixture device from the first position to a third position when the captured media do not match with the detection parameter.

8. The detection method of claim 7, further comprising:
when the fixture device is in the first position, wirelessly receiving a first identification signal to the control circuit; and
transmitting, by the control circuit, a file related to the media to the fixture device through the power line.

* * * * *